United States Patent
Niwa et al.

(10) Patent No.: US 11,326,917 B2
(45) Date of Patent: May 10, 2022

(54) SEMICONDUCTOR INTEGRATED CIRCUIT DEVICE

(71) Applicant: Rohm Co., Ltd., Kyoto (JP)

(72) Inventors: Isao Niwa, Kyoto (JP); Yuji Kaneda, Yokohama (JP); Yuzo Mizushima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 324 days.

(21) Appl. No.: 16/537,842

(22) Filed: Aug. 12, 2019

(65) Prior Publication Data
US 2020/0064168 A1    Feb. 27, 2020

(30) Foreign Application Priority Data

Aug. 22, 2018 (JP) .............................. JP2018-155383
Jun. 18, 2019 (JP) .............................. JP2019-112637

(51) Int. Cl.
| | |
|---|---|
| *G01F 1/667* | (2022.01) |
| *H01L 23/495* | (2006.01) |
| *H03K 5/24* | (2006.01) |
| *H03F 3/68* | (2006.01) |
| *H03F 3/45* | (2006.01) |

(Continued)

(52) U.S. Cl.
CPC ........ *G01F 1/667* (2013.01); *H01L 23/49541* (2013.01); *H03F 3/45071* (2013.01); *H03F 3/45475* (2013.01); *H03F 3/68* (2013.01); *H03K 5/24* (2013.01); *H01L 24/48* (2013.01); *H01L 24/49* (2013.01); *H01L 2224/48247* (2013.01); *H01L 2224/49173* (2013.01); *H03B 5/24* (2013.01); *H03B 5/36* (2013.01); *H03F 2200/129* (2013.01); *H03F 2200/48* (2013.01); *H03F 2203/45116* (2013.01); *H03K 3/0315* (2013.01)

(58) Field of Classification Search
CPC ... G01F 1/667; G01F 1/662; H01L 23/49541; H01L 24/49; H01L 24/48; H01L 2224/48247; H01L 2224/49173; H01L 24/05; H01L 2224/06135; H01L 24/06; H01L 2924/181; H01L 2224/05554; H01L 2924/00014; H01L 2224/49171; H03K 5/24; H03K 3/0315; H03F 3/68; H03F 3/45071; H03F 2200/129; H03F 2203/45116; H03F 2200/48; H03F 2200/03; H03F 3/187; H03F 3/45475; H03B 5/36; H03B 5/24

See application file for complete search history.

(56) References Cited

U.S. PATENT DOCUMENTS

2009/0051427 A1* 2/2009 Miyashita ............... H03F 3/213
                                                                          330/251

FOREIGN PATENT DOCUMENTS

JP    2007-304095    11/2007

* cited by examiner

*Primary Examiner* — Jung Kim
(74) *Attorney, Agent, or Firm* — Fish & Richardson P.C.

(57) ABSTRACT

A semiconductor integrated circuit device includes a first terminal arranged to accept an external input of an analog input signal, an amplifier configured to amplify the analog input signal to generate an amplified signal, a logic unit configured to generate a digital output signal that is in accordance with the amplified signal, and a second terminal arranged to externally output an analog output signal that is in accordance with the amplified signal. The first terminal is disposed at a first side of a package, and the second terminal is disposed at a second side which is different from the first side.

16 Claims, 7 Drawing Sheets

(51) Int. Cl.
*H03K 3/03* (2006.01)
*H01L 23/00* (2006.01)
*H03B 5/36* (2006.01)
*H03B 5/24* (2006.01)

SEMICONDUCTOR INTEGRATED CIRCUIT DEVICE

CROSS-REFERENCE TO RELATED APPLICATIONS

This application is based on Japanese Patent Applications No. 2018-155383 filed on Aug. 22, 2018 and No. 2019-112637 filed on Jun. 18, 2019, the contents of which are hereby incorporated by reference.

BACKGROUND OF THE INVENTION

1. Field of the Invention

The invention disclosed herein is related to semiconductor integrated circuit devices.

2. Description of Related Art

Figure 6:
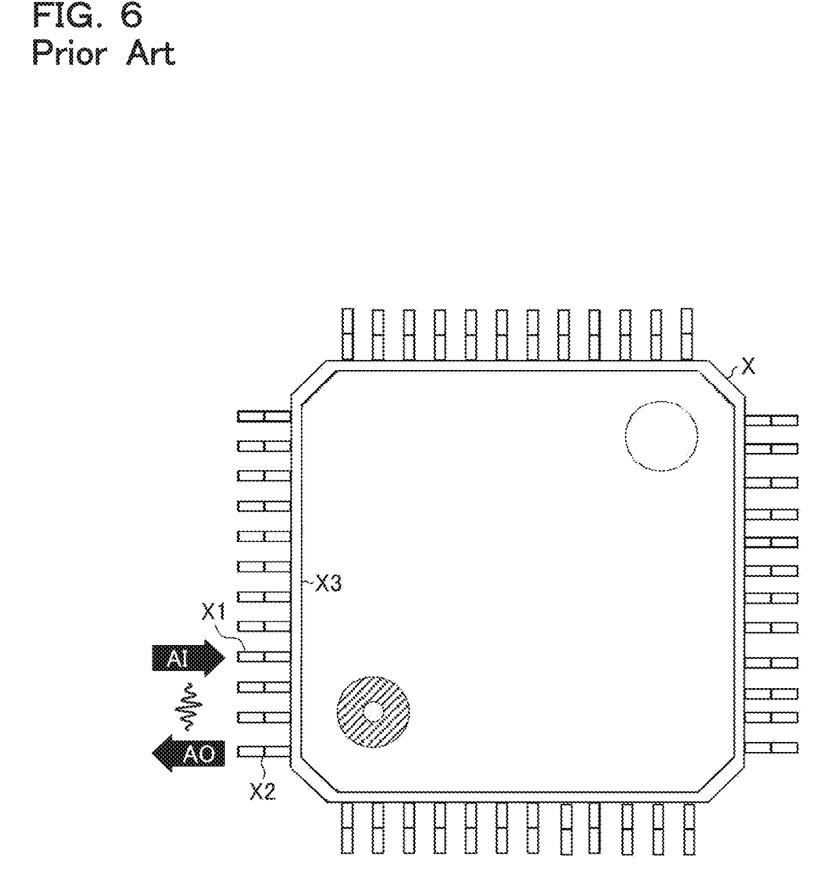
FIG. 6 is a diagram showing an example of conventional semiconductor integrated circuit devices.

FIG. 6 is a diagram showing a conventional example of semiconductor integrated circuit devices. According to this conventional example, a semiconductor integrated circuit device X has a function of amplifying therein an analog input signal AI externally inputted from a sensor or the like to provide the resulting amplified signal for various kinds of internal processing. The semiconductor integrated circuit device X further has, as means for checking for proper amplification of the analog input signal AI therein, a function of externally outputting an analog output signal AO that is in accordance with the resulting amplified signal.

An example of conventional technology related to this is disclosed in Japanese Patent Application Publication No. 2007-304095.

However, in the conventional semiconductor integrated circuit device X, a terminal X1 arranged to accept the external input of the analog input signal AI and a terminal X2 arranged to externally output the analog output signal AO are both disposed, side by side, at one side X3 of a package X3.

With such a configuration, there is a risk of mutual interference between the analog input signal AI and the analog output signal AO ascribable to, for example, capacitive coupling between the terminals X1 and X2 (for example, between parallelly arranged parts of board wiring patterns respectively connected to the terminals X1 and X2 outside the semiconductor integrated circuit device X, or between parallelly arranged parts of wires respectively connected to the terminals X1 and X2 inside the semiconductor integrated circuit device X).

SUMMARY OF THE INVENTION

The invention disclosed herein has been made in view of the above-mentioned problem found by the inventors of the invention, and an object thereof is to provide a semiconductor integrated circuit device capable of reducing mutual interference between analog input and analog output.

In order to achieve the object, a semiconductor integrated circuit device disclosed herein includes a first terminal arranged to accept an external input of an analog input signal, an amplifier configured to amplify the analog input signal to generate an amplified signal, a logic unit configured to generate a digital output signal that is in accordance with the amplified signal, and a second terminal arranged to externally output an analog output signal that is in accordance with the amplified signal. Here, the first terminal is disposed on a first side of a package, and the second terminal is disposed on a second side which is different from the first side.

Other features, constituent components, operational steps, advantages, and characteristics of the present invention will be further clarified by the following detailed descriptions of embodiments and accompanying drawings related thereto.

DETAILED DESCRIPTION OF PREFERRED EMBODIMENTS

Ultrasonic Flowmeter

Figure 1:
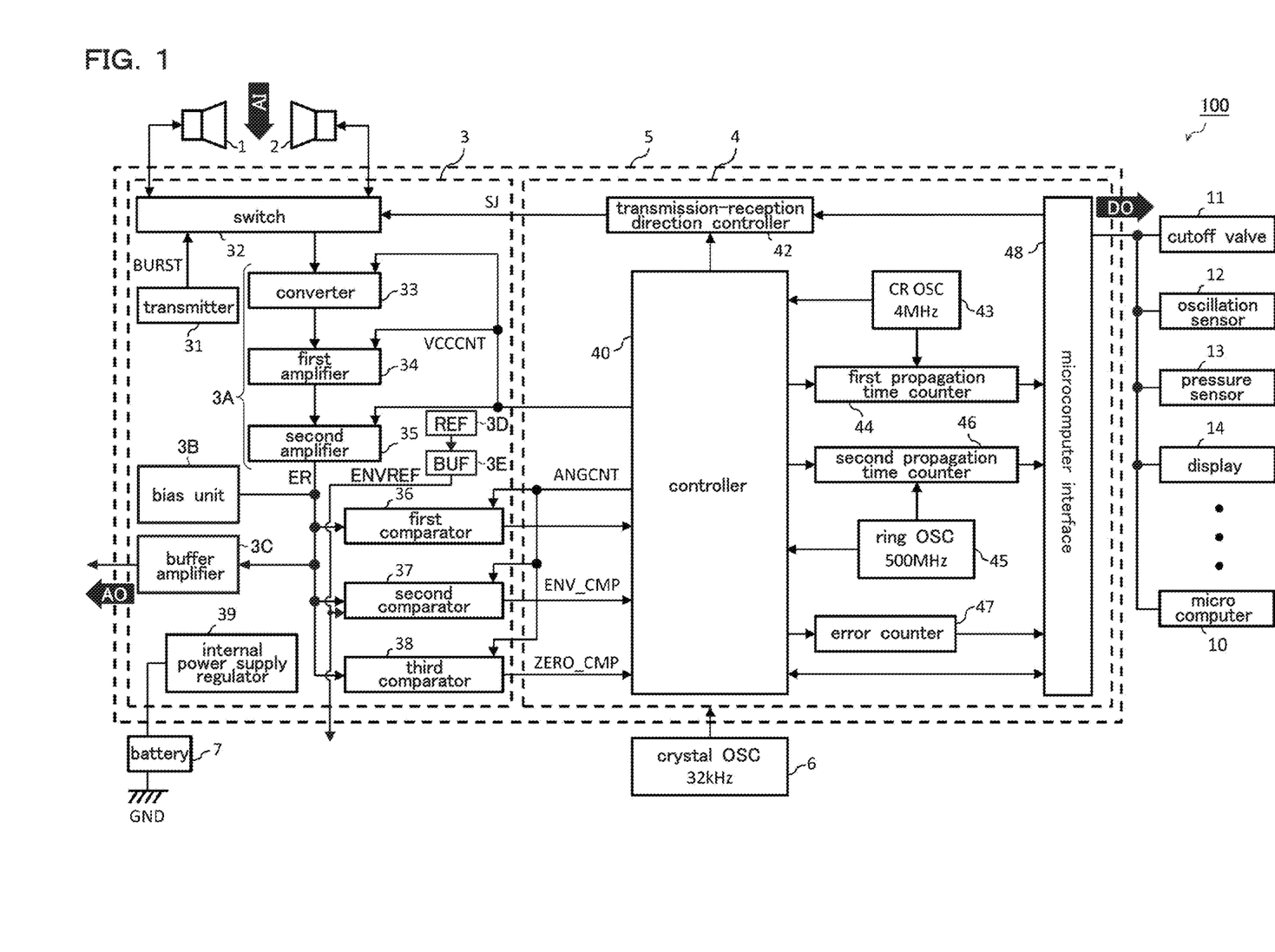
FIG. 1 is a diagram showing an entire configuration of an ultrasonic flowmeter.

FIG. 1 is a diagram showing an entire configuration of an ultrasonic flowmeter. An ultrasonic flowmeter 100 illustrated in this figure includes a first vibrator 1 and a second vibrator 2. The first vibrator 1 and the second vibrator 2 are oppositely arranged in an unillustrated fluid pipe at a predetermined angle with respect to a flow of fluid. For example, the first vibrator 1 is arranged on the upstream side of the fluid, while the second vibrator 2 is arranged on the downstream side of the fluid.

Here, with C representing the sonic velocity, and v representing the flow velocity, the propagation velocity of an ultrasonic wave traveling from upstream side to downstream side of the fluid is represented by (C+v), and the propagation velocity of an ultrasonic wave traveling from downstream side to upstream side is represented by (C−v). From the difference between these propagation velocities (and thus from the difference between propagation times), the flow velocity v is determined; and further, a flow rate Q (=v·S·K, where S representing the sectional area of the fluid pipe, K representing a correction coefficient) is calculated.

The ultrasonic flowmeter 100 further includes: a semiconductor integrated circuit device 5 having an analogue unit 3 and a logic unit 4; and a first oscillator 6, a battery 7, a cutoff valve 11, an oscillation sensor 12, a pressure sensor 13, a display 14, and a microcomputer 10, which are disposed outside the semiconductor integrated circuit device 5, and so forth.

The first oscillator 6 generates a clock with a frequency of, for example, 32 kHz (more accurately 32.768 kHz). Herein, the clock generated by the first oscillator 6 will be referred to as a "low-speed clock".

The analog unit 3 includes a transmitter 31, a switch 32, a converter 33, a first amplifier 34, a second amplifier 35, a first comparator 36, a second comparator 37, a third comparator 38, and an internal power supply regulator 39.

The first amplifier 34 and the second amplifier 35 (or these plus the converter 33) can also be understood as a receiving amplifier 3A which generates a reception signal ER (=an amplified signal) by amplifying the analog input signal AI externally inputted from the first vibrator 1 or the second vibrator 2.

The analog unit 3 further includes a bias unit 3B and a buffer amplifier 3C. Furthermore, the analog unit 3 includes a threshold voltage generator 3B and a buffer amplifier 3E.

The transmitter 31 outputs a burst wave BURST to one of the first vibrator 1 and the second vibrator 2 via the switch 32. The burst wave BURST is a rectangular wave signal, a sine wave signal, or the like that is intermittently generated at a predetermined frequency (for example, 520 kHz). The number of pulses N of the burst wave BURST, which is appropriately set depending on the kind of the first vibrator 1 and the second vibrator 2 or on the kind of the ultrasonic flowmeter 100, is set at, for example, 4 to 6.

The switch 32 receives a transmission-reception direction control signal SJ from the logic unit 4, and switches the burst-wave-BURST transmitting side between the first oscillator 1 and the second oscillator 2. When the first vibrator 1 is set as the burst-wave-BURST transmitting side, the second vibrator 2 serves as the burst-wave-BURST receiving side, and when the second vibrator 2 is set as the burst-wave-BURST transmitting side, the first vibrator 1 serves as the burst-wave-BURST receiving side.

The converter 33 converts the output format of the signal received by the first vibrator 1 or the second vibrator 2 via the switch 32. Specifically, in a case where the output format of the signal is a current output format, the converter 33 performs what is called I/V conversion processing, in which a current signal is converted into a voltage signal. On the other hand, in a case where the output format of the signal is a voltage output format, the converter 33 performs processing of converting a voltage signal of a certain level into a voltage signal of a different level, which is, in short, V/V conversion processing. However, in a case where such a V/V conversion processing is unnecessary, the converter 33 may be omitted.

The first amplifier 34 amplifies the signal inputted from the first vibrator 1 or the second vibrator 2 via the converter 33 by a predetermined first gain, and thereby performs coarse adjustment of the amplitude of the amplified signal.

The second amplifier 35 further amplifies, by a predetermined second gain, the signal that has been amplified by the first amplifier 34, and thereby minutely adjusts the amplitude of the amplified signal to a predetermined magnitude.

If one of the first amplifier 34 and the second amplifier 35 has a gain adjustment function, it is possible to omit the other one of them. Usable as an amplifier having the gain adjustment function is a programmable-gain amplifier (PGA) of which the gain is adjustable in a plurality of stages (for example, 256 stages). Herein, a "reception signal ER" is synonymous with the amplified signal outputted from the receiving amplifier 3A.

Further, an enable signal VCCCNT is inputted to each of the converter 33, the first amplifier 34, and the second amplifier 35. For example, when the enable signal VCCCNT is set at high level, the converter 33, the first amplifier 34, and the second amplifier 35 are in an enabled state (that is, ready to execute a predetermined circuit operation).

The first comparator 36 determines whether or not a peak value of the reception signal ER (=the output signal from the receiving amplifier 3A) is within a predetermined range.

The second comparator 37 has a role of what is called an envelope (envelope curve) comparator, which determines whether or not the reception signal ER exceeds a predetermined threshold value. For example, an envelope comparison signal ENV_CMP is high level when the reception signal ER is above a predetermined threshold voltage ENVREF, and low level when the reception signal ER is below the threshold voltage ENVREF.

The third comparator 38 detects a zero crossing point of the reception signal ER. For example, the third comparator 38 generates a zero-crossing-point detection signal ZERO_CMP, which becomes high level when the reception signal ER is above the zero crossing point and low level when the reception signal ER is below the zero crossing point.

The internal power supply regulator 39 stabilizes an external power supply voltage (for example, 1.8 V or 2.2 V) supplied from the battery 7 to generate an internal power supply voltage for driving the analog unit 3 and the logic unit 4. Usable as the battery 7 is, for example, a lithium ion battery.

An enable signal ANGCNT is inputted to each of the first comparator 36, the second comparator 37, and the third comparator 38. For example, when the enable signal ANGCNT is set at high level, the first comparator 36, the second comparator 37, and the third comparator 38 become enabled.

As already mentioned, the receiving amplifier 3A amplifies the analog input signal AI externally inputted from the first vibrator 1 or the second vibrator 2, and thereby generates the reception signal ER (=an amplified signal).

The bias unit 3B sets a bias potential of the reception signal ER (=an amplified signal).

The buffer amplifier 3C accepts input of the reception signal ER outputted from the receiving amplifier 3A, and, in a test mode of the semiconductor integrated circuit device 5, the buffer amplifier 3C outputs the analog output signal AO that is in accordance with the above-described reception signal ER (=an amplified signal) to outside the semiconductor integrated circuit device 5.

The threshold voltage generator 3D generates the threshold voltage ENVREF mentioned above.

The buffer amplifier 3E outputs the threshold voltage ENVREF, which has been inputted from the threshold voltage generator 3D, to the second comparator 37.

The logic unit 4 is a circuit block that generates a digital output signal DO that is in accordance with the reception signal ER (more in detail, output signals of the comparators 36 to 38), and includes a controller 40, a transmission-reception direction controller 42, a second oscillator 43, a first propagation time counter 44, a third oscillator 45, a second propagation time counter 46, an error counter 47, and a microcomputer interface 48.

The controller 40 is the central portion of the logic unit 4, and performs measurement of the propagation time of fluid (such as gas), examination of clocks generated by the second oscillator 43 and the third oscillator 45, and various control of the analog unit 3. The controller 40 also has a function of performing gain adjustment for the first amplifier 34 and the second amplifier 35 based on various kinds of signals inputted from the analog unit 3. Here, in the gain adjustment, for example, one possibility is that up to 40 db (100 times) is divided by 128 and the gains are digitally adjusted in steps 1 to 128.

The transmission-reception direction controller 42 generates a transmission-reception direction control signal SJ in accordance with an instruction from the controller 40 or the microcomputer interface 48.

The second oscillator 43 is constituted by a CR oscillator using a resistor and a capacitor, for example. More specifically, adoptable as the second oscillator 43 is, for example, a CR oscillator which generates a clock by charging and discharging a capacitor at a constant current. The frequency of the clock generated by the second oscillator 43 is set, for example, as 4 MHz. Further, the second oscillator 43 may be, instead of a CR oscillator, an unillustrated ceramic oscillator disposed outside the semiconductor integrated circuit device 5. Herein, the clock generated by the second oscillator 43 is referred to as a "mid-speed clock".

In particular, with the second oscillator 43 incorporated in the semiconductor integrated circuit device 5, there is no need of providing a CR oscillator or a ceramic oscillator which has conventionally been prepared outside the semiconductor integrated circuit 5, and this makes it possible to provide a smaller, less expensive ultrasonic flowmeter 100.

The first propagation time counter 44 counts the clock generated by the second oscillator 43.

The third oscillator 45 is constituted by, for example, a ring oscillator. The frequency of the clock generated by the third oscillator 45 is set, for example, as 500 MHz. Herein, the clock generated by the third oscillator 45 is referred to as a "high-speed clock".

The second propagation time counter 46 counts the clock generated by the third oscillator 45.

As described above, "the low-speed clock", "the mid-speed clock", and "the high-speed clock" are oscillation signals generated by the first oscillator 6, the second oscillator 43, and the third oscillator 45, respectively. The high-speed clock has a propagation time shorter than that of the mid-speed clock, and the mid-speed clock has a propagation time shorter than that of the low-speed clock. In other words, the relationship between the frequencies of these clocks is represented by high-speed clock >mid-speed clock >low-speed clock.

The error counter 47 counts the number of errors occurring while the propagation time of a fluid is measured M times. Here, the following cases are each recognized as an error: a case where the reception signal ER is larger than a predetermined threshold value ER_H_Vth (a high error), a case where the reception signal ER is smaller than a predetermined threshold value ER_L_Vth (a low error); and a case where no reception signal ER is detected despite passage of a predetermined time since transmission of the burst wave BURST (an overflow).

In measuring propagation time, when measurements of from upstream side to downstream side and from downstream side to upstream side of the fluid pipe is one packet of measurement, 64 packets of measurements are performed, for example, and it is the role of the error counter 47 to count the number of errors occurring in the measurements. For example, in a case where, in the 64 packets of measurements, ten or more errors occur, readjustment and resetting, for example, of the gains are to be performed in the first amplifier 34 and the second amplifier 35 of the analogue portion 3, for example. This number of times is settable as necessary based on the level of accuracy required of the ultrasonic flowmeter 100. Note that, without the error counter 47, there is a risk of degraded accuracy of the ultrasonic flowmeter 100. However, the error counter 47 is not an essential component.

The microcomputer interface 48 functions as a relay device, sending various data extracted from each of the first propagation time counter 44, the second propagation time counter 46, and the error counter 47 to the microcomputer 10 prepared outside the semiconductor integrated circuit device 5, so as to make the microcomputer 10 perform various computing processes.

Further, the microcomputer 10 controls the cutoff valve 11, the oscillation sensor 12, the pressure sensor 13, and the display 14, for example, which are disposed outside the semiconductor integrated circuit device 5 as means for achieving subsidiary functions of the ultrasonic flowmeter 100.

<Pin Arrangement>

Figure 2A:
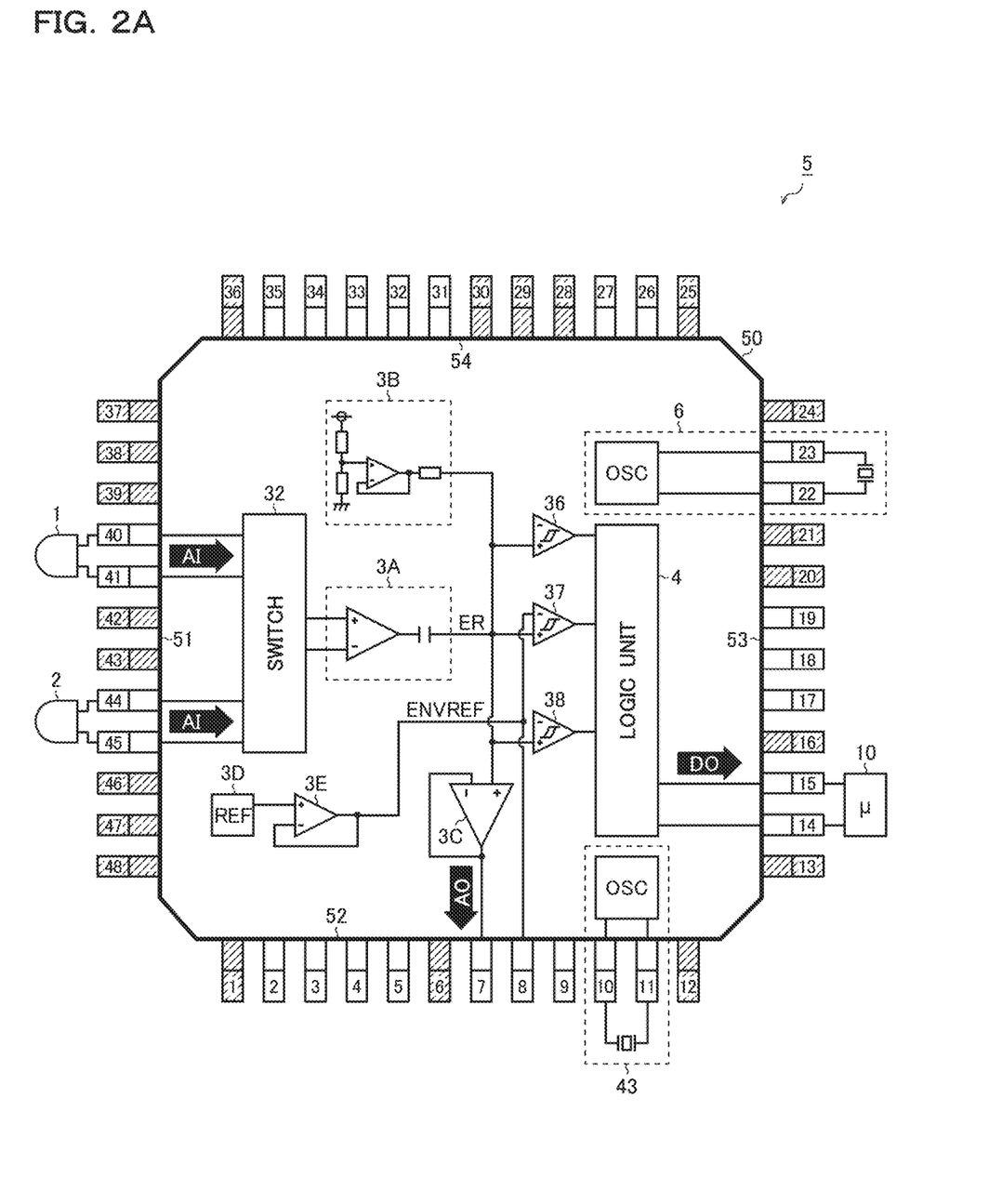
FIG. 2A is a diagram showing a pin arrangement (first example) of a semiconductor integrated circuit device.

FIG. 2A is a diagram showing a pin arrangement (first example) of the semiconductor integrated circuit device 5. The semiconductor integrated circuit device 5 has a package 50, as which is adopted a 48-pin quad flat package (QFP) (=a package which has a total of 48 bent pins, 12 bent pins of which are extracted from each of the four sides of the package).

With the upward, downward, leftward, and rightward directions on the sheet of the figure defined as the upward, downward, leftward, and rightward directions in plan view of the package 50, respectively, at a lower side 52 (corresponding to a second side) of the package 50, there are disposed pins 1 to 12 arranged in order from the left side of the sheet of the figure. At a right side 53 (corresponding to a third side) of the package 50, there are disposed pins 13 to 24 arranged in order from the lower side of the sheet of the figure. At an upper side 54 (corresponding to a fourth side) of the package 50, there are disposed pins 25 to 36 arranged in order from the right side of the sheet of the figure. At a left side 51 (corresponding to a first side) of the package 50, there are disposed pins 37 to 48 arranged in order from the upper side of the sheet of the figure. Functions of these pins will be briefly described below.

Pin 1 (N.C.) is an unused terminal. Pin 2 (VBG) is a band gap voltage output terminal. Pin 3 (VIN) is a battery power supply terminal. Pin 4 (SWVREG) is an H-bridge regulator power supply. Pin 5 (VREG) is an LDO regulator output terminal (an analog block power supply terminal (2.2V)). Pin 6 (AVSS) is an analog ground terminal. Pin 7 (A3INP) is an amplifier output monitor terminal. Pin 8 (ENVREF) is an envelope threshold voltage monitor terminal. Pin 9 (HALT) is a regulator/ceramic vibrator control terminal (L=OFF, H=ON). Pin 10 (XTOUT) is a ceramic vibrator output terminal. Pin 11 (XTIN) is a ceramic vibrator input terminal. That is, between pins 10 and 11, a ceramic vibrator constituting the second oscillator 43 is externally connected. Pin 12 (TEST3) is a test input-output terminal (L output in normal operation).

Pin 13 (N.C.) is an unused terminal. Pin 14 (SCL) is a serial interface clock terminal. Pin 15 (SDA) is a serial interface data terminal. That is, the microcomputer 10 is externally connected to pins 14 and 15. Pin 16 (VISIO) is an interface ground terminal. Pin 17 (SIORQ) is a measurement cycle check terminal. Pin 18 (DIR) is a downstream/upstream-direction monitoring signal terminal. Pin 19 (VCCCNT) is an amplifier power supply control terminal (L=OFF, H=ON). Pin 20 (TEST4) and pin 21 (TEST5) are test input-output terminals (L output in normal operation). Pin 22 (XTOUT2) is a crystal vibrator output terminal. Pin 23 (XTIN2) is a crystal vibrator input terminal. That is, between pins 22 and 23, a crystal vibrator constituting the first oscillator 6 is externally connected. Pin 24 (TEST6) is a test input-output terminal (L output in normal operation).

Pin 25 (DVSS) is a digital ground terminal. Pin 26 (RESET) is a reset input terminal (enabled when L). Pin 27 (IORQ) is an interruption output terminal. Pins 28 (TEST0), 29 (TEST1), and 30 (TEST2) are test input terminals (ground connected in normal operation). Pin 31 (VREG2) is an LDO regulator output terminal (a digital block power supply terminal (1.8V)). Pin 32 (DVDD) is a logic power supply terminal (short-circuited with VREG2 in PWB). Pin 33 (ZEOUT) is a zero-crossing comparator output terminal. Pin 34 (ANGCNT) is a comparator power supply control terminal (L=OFF, H=ON). Pin 35 (RCOSCRES) is a resistor connection terminal for an RC oscillator (=the second oscillator 43). Pin 36 (VSSRCOSC) is a ground terminal for the RC oscillator.

Pin 37 (OSCTEST) is an analog test input terminal (ground connected in normal operation). Pin 38 (TESTMODE) is a test mode control terminal (0=OFF, 1=ON, ground connected in normal operation). Pin 39 (PANATESTMODE) is a PANA test mode control terminal (0=OFF, 1=ON, ground connected in normal operation). Pin 40 (SNHP) and pin 41 (SNHL) are upstream ultrasonic wave conversion terminals. Here, between pins 40 and 41, the first vibrator 1 is externally connected. Pin 42 (VSSHBRDRVH) and pin 43 (VSSHBRDRVL) are each a ground terminal for an H-bridge output stage. Pin 44 (SNLN) and pin 45 (SNLP) are downstream ultrasonic wave conversion terminal. Here, between pins 44 and 45, the second vibrator 2 is externally connected. Pin 46 (AVSS) and pin 47 (AVSS) are analog ground terminals. Pin 48 (N.C.) is an unused terminal.

Of the 48 pins described just above, pin 40 (SNHP) and pin 41 (SNHL) and pin 44 (SNLN) and pin 45 (SNLP) correspond to first terminals arranged to accept an external input of the analog input signal AI. Pin 7 (A3INP) corresponds to a second terminal arranged to externally output the analog output signal AO that is in accordance with the reception signal ER (=an amplified signal). Pin 15 (SDA) corresponds to a third terminal arranged to externally output the digital output signal DO. Pin 8 (ENVREF) corresponds to a fourth terminal arranged to externally output the threshold voltage ENVREF to be compared with the reception signal ER (=an amplified signal).

Here, the first terminals (pins 40, 41, 44, and 45) functioning as analog input terminals are disposed at the first side 51 of the package 50. In contrast, the second terminal (pin 7) functioning as an analog output terminal is disposed at the second side 52, which is a side different from the first side 51.

With such a pin arrangement, it is possible to reduce interference ascribable to, for example, mutual capacitive coupling between the analog input and output, as compared to the conventional example (FIG. 6) where an analog input terminal and an analog output terminal are both disposed at the same one side. Accordingly, it is possible to improve the measurement accuracy of the ultrasonic flowmeter 100 while monitoring the analog output signal AO.

For example, in a case where the receiving amplifier 3A has a high gain (for example, 60 dB or more), there has conventionally been generated an offset flow rate (an error detected at a zero-flow-rate time, when no fluid flows) of about 20 L/h, but the adoption of the above-described pin arrangement contributes to improvement by reducing the offset flow rate to substantially 0 L/h.

Here, although the description with reference to the present figure has dealt with an example where the analog output terminal is disposed at the second side 52, since the analog output terminal may be disposed at any side except the first side 51, one of the pins disposed at the third side 53 or the fourth side 54 may function as the analog output terminal.

Further, a characteristic internal configuration of the semiconductor integrated circuit device 5 will be described. First, a description will be given of the arrangement position of the first oscillator 6, which generates "the low-speed clock", which is the slowest but the most accurate one of the plurality of clocks.

It is desirable that the first oscillator 6 be disposed, of the four sides of the package 50, near one side (=the right side 53) where logic output is performed with little noise. More specifically, it is desirable that the first oscillator 6 be disposed near an upper right corner of the package 50 formed by the above-mentioned right side 53 and the upper side 54, at which the digital ground terminal (pin 25) and the test terminals (pin 28, pin 29, and pin 30) are disposed.

Further, preferably, on opposite sides with respect to pin 22 and pin 23, to both of which the crystal vibrator of the first oscillator 6 is connected, test input-output terminals (pins 21, pin 24) are respectively disposed which are set at low level in normal operation.

Next, a description will be given of the arrangement position of the second oscillator 43, which generates "the mid-speed clock", which is the second most accurate clock of the plurality of clocks and used as a control clock.

It is desirable that, like the first oscillator 6, the second oscillator 43 be disposed near, of the four sides of the package 50, one side (=the right side 53) where logic output is performed with little noise. More specifically, it is preferable that the second oscillator 43 be disposed near serial communication terminals (pin 14, pin 15) between the logic unit 4 and the microcomputer 10.

Further, preferably, adjacent to at least one of pin 10 and pin 11 (in the figure, adjacent to pin 11) to both of which the ceramic vibrator of the second oscillator 43 is connected, the test input-output terminal (pin 12) is disposed which is set at low level in normal operation.

Next, a description will be given of a signal path inside the semiconductor integrated circuit device 5. By disposing the analog input terminals (pin 40, pin 41, pin 44, pin 45) at the left side 51 of the package 50, and digital output terminals (pin 14, pin 15) at the right side 53 of the package 50, a straight-line signal path is formed from the analog input terminals to the digital output terminals.

The receiving amplifier 3A and the comparators 36 to 38 are arranged in a first direction (=the left-right direction on the sheet) that is along the above-mentioned signal path, the receiving amplifier 3A being disposed on the upstream side, the comparators 36 to 38 being disposed on the downstream side. Note that the comparators 36 to 38 are arranged side by side in a second direction (=the up-down direction on the sheet) which is perpendicular to the first direction mentioned above.

Further, to a connection node between the receiving amplifier 3A and the comparators 36 to 38, a signal line extending in the above-mentioned second direction is connected. Via the buffer amplifier 3C connected to this signal line, the analog output signal AO is outputted to outside the semiconductor integrated circuit device 5. Note that the buffer amplifier 3C is arranged along the second direction mentioned above.

The analog output terminal (pin 7) is preferably disposed, not either at the left side 51, where the analog input terminals (pin 40, pin 41, pin 44, pin 45) are disposed, or at the right side 53, where the digital output terminals (pin 14, pin 15) are disposed, but at the lower side 52, which is a side different from the two sides mentioned just above.

Further, it is desirable that the analog output terminal (pin 7) be disposed near the center of the lower side 52, and it is preferable that the analog ground terminal (pin 6) be disposed adjacent to the analog output terminal.

<Pin-Arrangement Changing Experiment>

Figure 3:
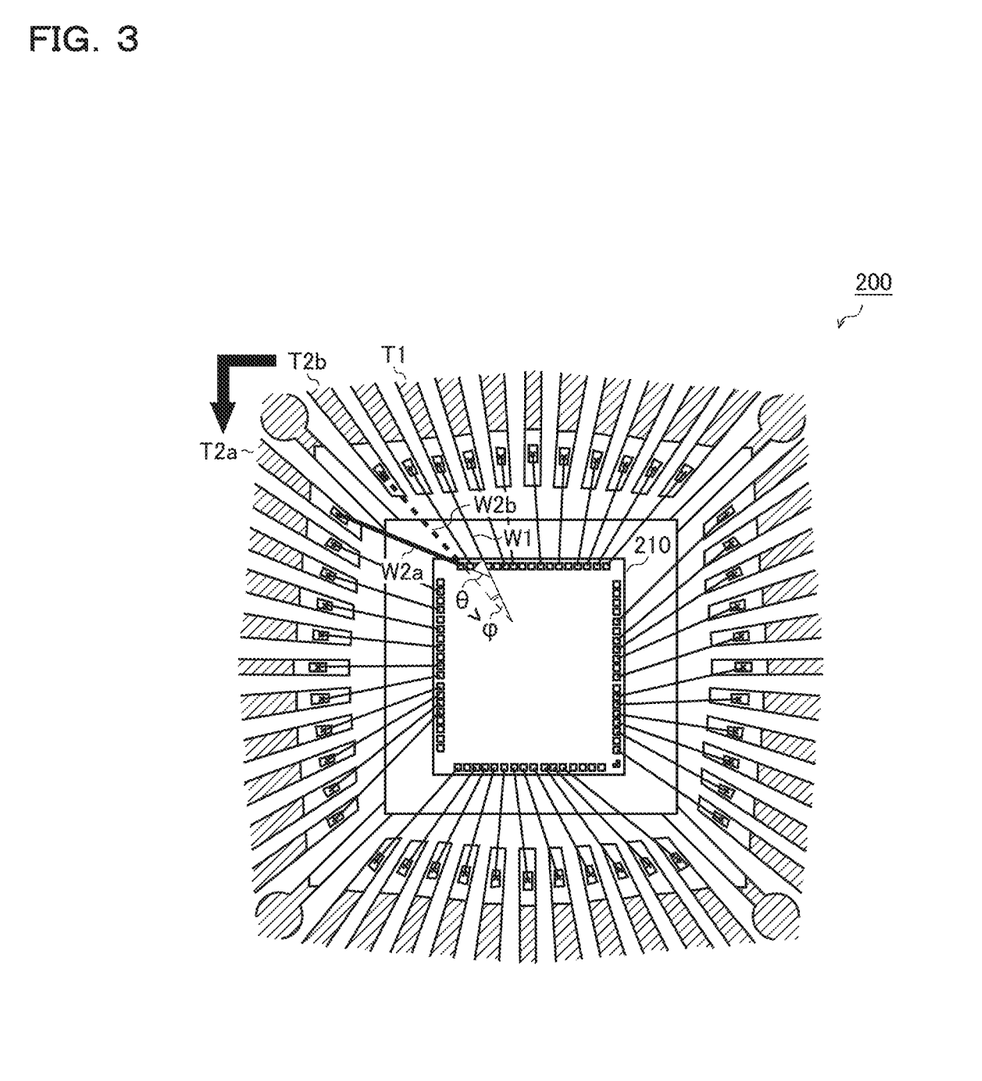
FIG. 3 is a diagram showing an internal structure of a semiconductor integrated circuit device provided for a pin-arrangement changing experiment.

FIG. 3 is a diagram showing an internal structure of a semiconductor integrated circuit device provided for a pin-arrangement changing experiment. In a semiconductor integrated circuit device 200 illustrated in this figure, a terminal T1 corresponds to the first terminal arranged to accept the external input of the analog input signal AI, and is connected via a wire W1 to a semiconductor chip 210. On the other hand, terminals T2a and T2b each correspond to the second terminal arranged to externally output the analog output signal AO.

In the pin-arrangement changing experiment, measurement was performed of the behavior of the analog output signal AO (=the reception signal ER), in a reception stand-by state, with respect to a first pin arrangement (=a case where the terminal T2b disposed at the same side as the terminal T1 is connected via a wire W2b to an analog output pad of the semiconductor chip 210 such that the analog output signal AO is externally outputted from the terminal T2b), and a second pin arrangement (=a case where the terminal T2a disposed at a side different from the terminal T1 is connected via a wire W2a to the analog output pad of the semiconductor chip 210 such that the analog output signal AO is externally outputted from the terminal T2a).

Figure 4:
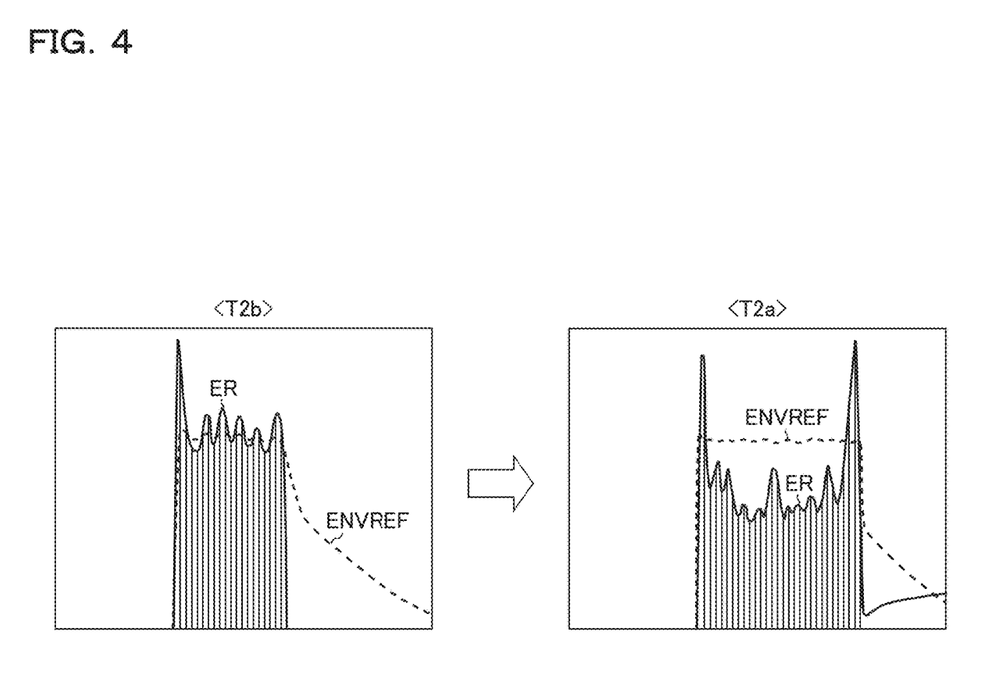
FIG. 4 is a diagram showing a result of the pin-arrangement changing experiment.

FIG. 4 is a diagram showing a result of the pin-arrangement changing experiment. As shown in the left part of the figure, with the first pin arrangement (=the case where, like in conventional cases, the analog output signal AO is outputted from the terminal T2b disposed at the same side as the terminal T1), even in the reception stand-by state, the analog output signal AO (=the reception signal ER) exceeded the threshold voltage ENVREF, and erroneous detection occurred.

On the other hand, as shown in the right part of the figure, with the second pin arrangement, (=the case where, unlike in the conventional cases, the analog output signal AO is outputted from the terminal T2a disposed at a side different from the terminal T1), even with high gain setting, the analog output signal AO (=the reception signal ER) did not exceed the threshold voltage ENVREF, and no erroneous detection occurred in the reception stand-by state.

Here, in order to achieve reduced interference between analog input and output described above, it is important to dispose the analog input terminals and the analog output terminal at different sides. This is because of the following reason: if the analog input terminals and the analog output terminal are disposed at the same side, wires connecting the terminals to the semiconductor chip run parallel with each other, so that it is impossible to avoid capacitive coupling between the wires, no matter how far away the terminals are spaced from each other.

In contrast, if the analog input terminals and the analog output terminal are disposed at different sides, the wires connecting the terminals to the semiconductor chip do not run parallel to each other. Specifically describing with reference back to FIG. 3, an angle θ formed by the terminal T1 and the terminal T2a is larger than an angle φ formed by the terminal T1 and the terminal T2b. Accordingly, it becomes possible to reduce the capacitive coupling between the wires.

Furthermore, for a further enhanced effect of reduced interference between the analog input and output, it is desirable to dispose the terminal T2a as far away from the terminal T1 as possible.

<Other Pin Arrangements>

With reference back to FIG. 2A, a description will be given of other pin arrangements. It is desirable that, in a plan view of the package 50, the third terminals (pin 14, pin 15) functioning as the digital output terminals be disposed not at the first side 51, at which the first terminals (pin 40, pin 41, pin 44, pin 45) are disposed, but at the third side 53, which is opposite from the first side 51.

With such a pin arrangement, the main signal path of the ultrasonic flowmeter 100 is linear-shaped extending from left side to right side on the sheet of the figure, and this allows simple wiring on the board on which the semiconductor integrated circuit device 5 is mounted.

Further, in the figure, the fourth terminal (pin 8) arranged to externally output the threshold voltage ENVREF is disposed adjacent to the second terminal (pin 7); however, for reducing fluctuation of the threshold voltage ENVREF, it is desirable that the fourth terminal mentioned just above be located at a position that is not adjacent to either the first terminals (pin 40, pin 41, pin 44, and pin 45) or the second terminal (pin 7).

Furthermore, for the same above-described reason, it is preferable that the fourth terminal be located at a position that is not adjacent to either the first terminals (pin 40, pin 41, pin 44, and pin 45), or the second terminal (pin 7), or the third terminal (pin 15) (that is, located as far away as possible from these terminals).

Figure 2B:
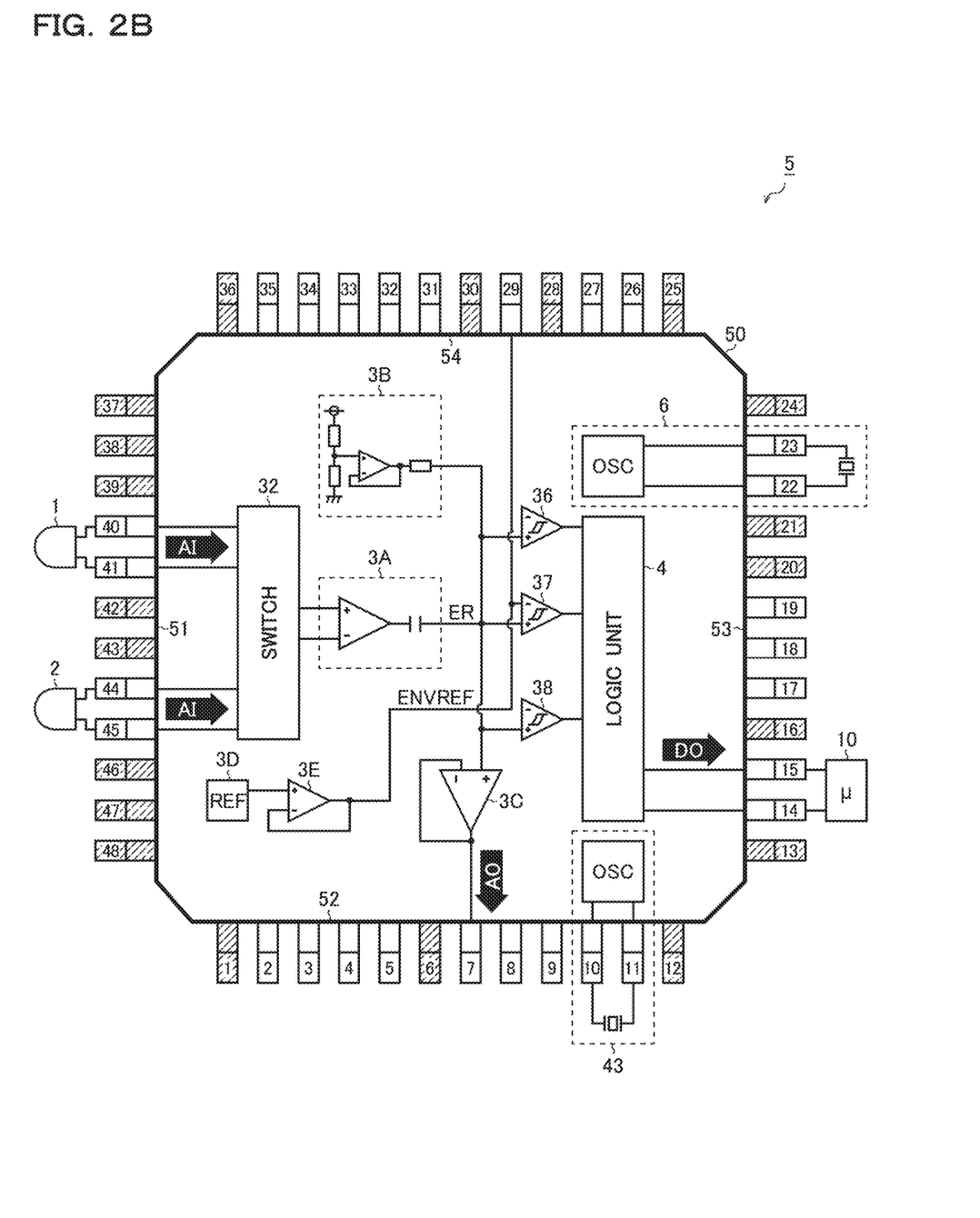
FIG. 2B is a diagram showing a pin arrangement (second example) of a semiconductor integrated circuit device.

In view of this, as shown in FIG. 2B, for example, it is desirable that one of pins 25 to 36 (for example, pin 29) be the fourth terminal (=the threshold voltage ENVREF externally outputting terminal).

Further, for the same above-described reason, it is desirable to dispose the buffer amplifier 3E between the threshold voltage generator 3D and the second comparator 37.

Further, it is desirable that a test terminal, a ground terminal, or an unused terminal (indicated by hatching in the present figure are unused terminals) be disposed adjacent to fifth terminals (pin 22 and pin 23, and pin 10 and pin 11) arranged to have the first oscillator 6 and the second oscillator 43 (in particular, their vibrators) externally connected thereto. A test terminal, a ground terminal, and an unused terminal are ground connected or opened in normal operation.

With such a pin arrangement, noise is unlikely to be superimposed on the fifth terminals, and this contributes to stable operation of each of the first oscillator 6 and the second oscillator 43.

Further, sixth terminals (pin 1, pin 12, pin 13, pin 24, pin 25, pin 36, pin 37, and pin 48) disposed at four corners of the package 50 (that is, at opposite ends of each of the first to fourth sides 51 to 54) are each preferably a test terminal, a ground terminal, or an unused terminal mentioned above.

With such a pin arrangement, even when a short circuit occurs between terminals at any of the four corners of the package 50 when the semiconductor integrated circuit device 5 is mounted on the board, it does not hinder the operation of the semiconductor integrated circuit device 5, and this helps improve the mounting reliability.

<Transmitter>

Figure 5:
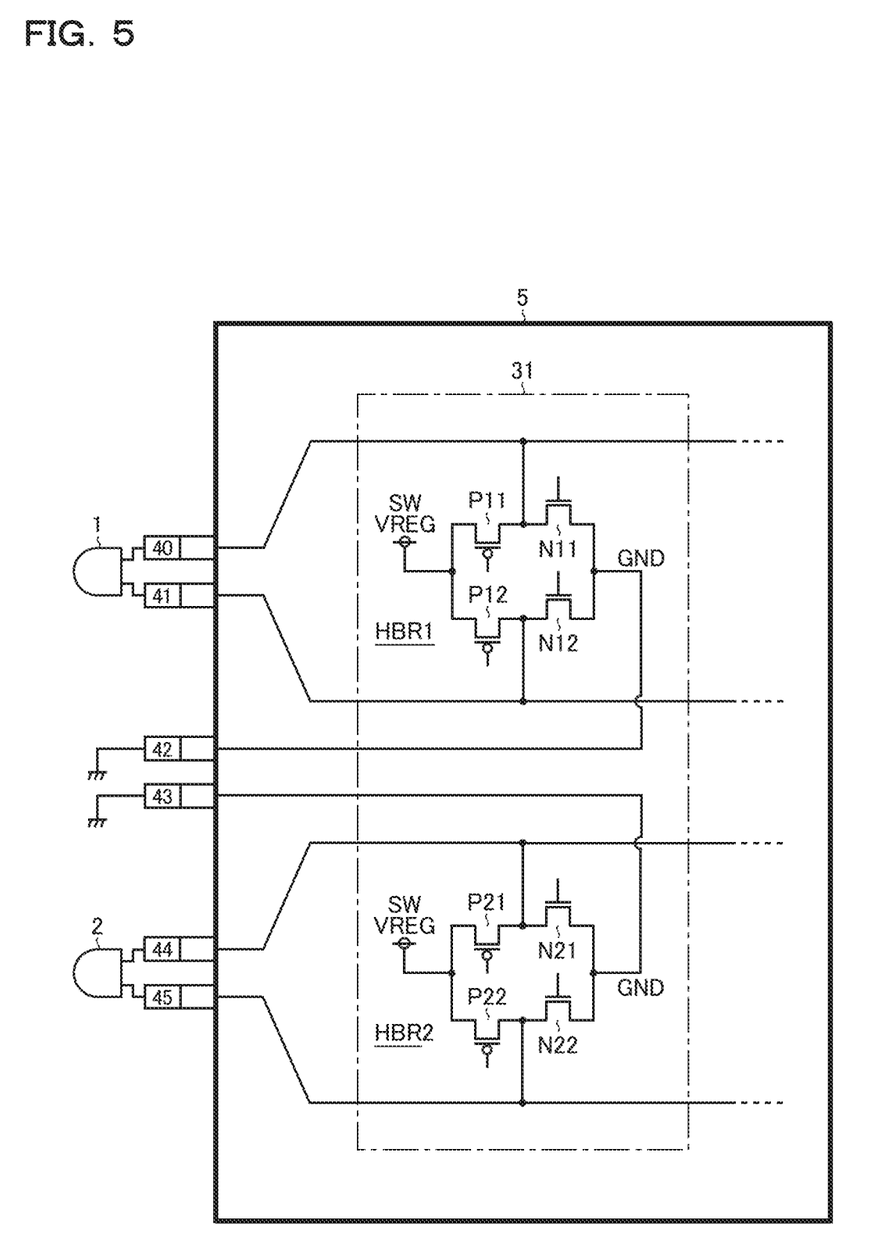
FIG. 5 is a diagram showing an example of the configuration of a transmitter.

FIG. 5 is a diagram showing an example of the configuration of the transmitter 31. The transmitter 31 having this configuration includes two H-bridge output stages HBR1 and HBR2.

The H-bridge output stage HBR1 is means that outputs a burst wave to the first vibrator 1, and includes P-channel type MOS field effect transistors P11 and P12, and N-channel type MOS field effect transistors N11 and N12.

Sources of the transistors P11 and P12 are connected to a regulator power supply SWVREG. Drains of the transistors P11 and N11 are connected to pin 40 (SNHP). Drains of the transistors P12 and N12 are connected to pin 41 (SNHN). Sources of the transistors N11 and N12 are connected to pin 42 (VSSHBRDRVH).

The H-bridge output stage HBR2 is a means that outputs a burst wave to the second vibrator 2, and includes P-channel type MOS field effect transistors P21 and P22, and N-channel type MOS field effect transistors N21 and N22.

Sources of the transistors P21 and P22 are connected to the regulator power supply SWVREG. Drains of the transistors P21 and N21 are connected to pin 44 (SNLN). Drains of the transistors P22 and N22 are connected to pin 45 (SNLP). Sources of the transistors N21 and N22 are connected to pin 43 (VSSHBRDRVL).

Thus, in the transmitter 31, reference potential lines (GND) of the H-bridge output stages HBR1 and HBR2 are respectively connected to independent ground terminals (pin 42 and pin 43), and thus are separated from each other.

Here, when burst-wave transmitting operation is performed by using the first vibrator 1, burst-wave receiving operation is performed by using the second vibrator 2. Reversely, when the burst-wave transmitting operation is performed by using the second vibrator 2, the burst-wave receiving operation is performed by using the first vibrator 1.

Thus, if the H-bridge output stages HBR1 and HBR2 shared a common reference potential line (GND), fluctuation of the reference potential on the transmitting side caused by the burst-wave transmitting operation would cause fluctuation of the reference potential on the receiving side, which might have a negative effect on the burst-wave receiving operation. In contrast, with the reference potential lines (GND) of the H-bridge output stages HBR1 and HBR2 separated from each other, no such inconvenience is caused.

<Other Modified Examples>

Although the above-described embodiments have dealt with, as examples, semiconductor integrated circuit devices adopting a QFP package, this is not meant as limitation to the kind of the package, and with any package having leads led out from at least two sides, such as a quad flat non-leaded package (QFN), a quad flat J-leaded package (QFJ), a small outline package (SOP), a small outline non-leaded package (SON), a small outline J-leaded package (SOJ), or a dual in-line package (DIP), the pin arrangements proposed above are effective.

Furthermore, in addition to the above embodiments, it is possible to add various modifications to the various technical features disclosed herein without departing from the spirit of the technological creation. In other words, it should be understood that the above embodiments are examples in all respects and are not limiting, the technological scope of the present invention is not limited to the above description of the embodiments, and all modifications within the scope of the claims and the meaning equivalent to the claims are covered.

<Overview>

To follow is an overview of the features of the various embodiments disclosed herein.

For example, a semiconductor integrated circuit device disclosed herein includes a first terminal arranged to accept an external input of an analog input signal, an amplifier configured to amplify the analog input signal to generate an amplified signal, a logic unit configured to generate a digital output signal that is in accordance with the amplified signal, and a second terminal arranged to externally output an analog output signal that is in accordance with the amplified signal. Here, the first terminal is disposed on a first side of a package, and the second terminal is disposed on a second side which is different from the first side (first configuration).

Preferably, the semiconductor integrated circuit device having the first configuration further includes a third terminal arranged to externally output the digital output signal (a second configuration).

Preferably, in the semiconductor integrated circuit device having the second configuration, the third terminal is disposed on a third side which is opposite from the first side (a third configuration).

Preferably, the semiconductor integrated circuit device having any one of the first to third configurations further includes a fourth terminal arranged to externally output a threshold voltage to be compared with the amplified signal, the fourth terminal being located at a position that is not adjacent to either the first terminal or the second terminal (fourth configuration).

Preferably, the semiconductor integrated circuit device having the second or third configuration further includes a fourth terminal arranged to externally output a threshold voltage to be compared with the amplified signal, the fourth terminal being located at a position that is not adjacent to the third terminal (fifth configuration).

Preferably, the semiconductor integrated circuit device having the fourth or fifth configuration further includes a threshold voltage generator configured to generate the threshold voltage, a comparator configured to generate a comparison signal by comparing the amplified signal with the threshold voltage and output the comparison signal to the logic unit, and a buffer amplifier disposed between the threshold voltage generator and the comparator (sixth configuration).

Preferably, the semiconductor integrated circuit device having any one of the first to sixth configuration further includes a fifth terminal arranged to have an oscillator externally connected thereto, and a terminal adjacent to the fifth terminal is a test terminal, a ground terminal, or an unused terminal (seventh configuration).

Preferably, in the semiconductor integrated circuit device having the seventh configuration, the fifth terminal is disposed at one side of four sides of the package, the one side being a side from which the digital output signal is outputted (eighth configuration).

Preferably, in the semiconductor integrated circuit device having any one of the first to eighth configurations, a sixth terminal disposed at each of four corners of the package is a test terminal, a ground terminal, or an unused terminal (ninth configuration).

Preferably, the semiconductor integrated circuit device having the third configuration further includes a comparator configured to generate a comparison signal by comparing the amplified signal with a predetermined threshold value and output the comparison signal to the logic unit, the amplifier and the comparator being arranged in a first direction which is along a signal path from the first terminal to the third terminal, the amplifier being disposed on an upstream side, the comparator being disposed on a downstream side (tenth configuration).

Preferably, in the semiconductor integrated circuit device having the tenth configuration, as the comparator, a plurality of comparators are arranged in a second direction which is perpendicular to the first direction (eleventh configuration).

Preferably, in the semiconductor integrated circuit device having the eleventh configuration, a signal line extending in the second direction is connected to a connection node between the amplifier and the comparator, and via a buffer amplifier connected to the signal line, the analog output signal is externally outputted from the second terminal (twelfth configuration).

Preferably, in the semiconductor integrated circuit device having the twelfth configuration, the second terminal is disposed near a center of the second side (thirteenth configuration).

Preferably, in the semiconductor integrated circuit device having any one of the first to thirteenth configuration, the analog input signal is a signal received by a vibrator that is externally connected to the first terminal (fourteenth configuration).

Preferably, the semiconductor integrated circuit device having the fourteenth configuration further includes a transmitter configured to output a burst wave to the vibrator (fifteenth configuration).

Preferably, in the semiconductor integrated circuit device having the fifteenth configuration, the transmitter includes a first output stage and a second output stage which output a burst wave to a first vibrator and a second vibrator, respectively, which are externally connected as the vibrator, and reference potential lines of the first and second output stages are separated from each other (sixteenth configuration).

An ultrasonic flowmeter disclosed herein includes the semiconductor integrated circuit device having the sixteenth configuration, and the first vibrator and the second vibrator which are oppositely arranged in an unillustrated fluid pipe at a predetermined angle with respect to a flow of fluid (seventeenth configuration).

With the semiconductor integrated circuit device disclosed herein, it is possible to reduce interference between analog input and output.

INDUSTRIAL APPLICABILITY

The invention disclosed herein is usable in, for example, an ultrasonic gas flow rate measuring system, and in addition, an LSI, a module product, and the like which require connection to a sensor.

What is claimed is:

1. A semiconductor integrated circuit device comprising:
a first terminal arranged to accept external input of an analog input signal;
an amplifier configured to amplify the analog input signal to generate an amplified signal;
a logic unit configured to generate a digital output signal that is in accordance with the amplified signal;
a second terminal arranged to externally output an analog output signal that is in accordance with the amplified signal; and
a further terminal arranged to externally output a threshold voltage to be compared with the amplified signal, wherein
the first terminal is disposed at a first side of a package, and the second terminal is disposed at a second side which is different from the first side, and the further terminal is located at a position that is not adjacent to either the first terminal or the second terminal.

2. The semiconductor integrated circuit device according to claim 1, further comprising a third terminal arranged to externally output the digital output signal.

3. The semiconductor integrated circuit device according to claim 2, wherein the third terminal is disposed at a third side which is opposite from the first side.

4. The semiconductor integrated circuit device according to claim 1, further comprising:
a threshold voltage generator configured to generate the threshold voltage;
a comparator configured to generate a comparison signal by comparing the amplified signal with the threshold voltage and output the comparison signal to the logic unit; and
a buffer amplifier disposed between the threshold voltage generator and the comparator.

5. The semiconductor integrated circuit device according to claim 1, further comprising another terminal arranged to have an oscillator externally connected thereto, wherein
a terminal adjacent to the other terminal is a test terminal, a ground terminal, or an unused terminal.

6. The semiconductor integrated circuit device according to claim 5, wherein
the other terminal is disposed at one side of four sides of the package, the one side being a side from which the digital output signal is outputted.

7. The semiconductor integrated circuit device according to claim 1, wherein
another terminal disposed at each of four corners of the package is a test terminal, a ground terminal, or an unused terminal.

8. The semiconductor integrated circuit device according to claim 3, further comprising a comparator configured to generate a comparison signal by comparing the amplified signal with a predetermined threshold value and output the comparison signal to the logic unit, wherein
the amplifier and the comparator are arranged in a first direction which is along a signal path from the first terminal to the third terminal, the amplifier being disposed on an upstream side, the comparator being disposed on a downstream side.

9. The semiconductor integrated circuit device according to claim 8, wherein
the comparator includes a plurality of comparators which are arranged in a second direction which is perpendicular to the first direction.

10. The semiconductor integrated circuit device according to claim 9, wherein
a signal line extending in the second direction is connected to a connection node between the amplifier and the comparator, and the analog output signal is externally outputted from the second terminal via a buffer amplifier connected to the signal line.

11. The semiconductor integrated circuit device according to claim 10, wherein the second terminal is disposed near a center of the second side.

12. The semiconductor integrated circuit device according to claim 1, wherein the analog input signal is a signal received by a vibrator that is externally connected to the first terminal.

13. The semiconductor integrated circuit device according to claim 12, further comprising a transmitter configured to output a burst wave to the vibrator.

14. The semiconductor integrated circuit device according to claim 13, wherein
the transmitter includes a first output stage and a second output stage configured to output a burst wave to a first vibrator and a second vibrator, respectively, the first vibrator and the second vibrator being externally connected as the vibrator, a reference potential line of the first output stage and a reference potential line of the second output stage being separated from each other.

15. An ultrasonic flowmeter, comprising:
the semiconductor integrated circuit device according to claim 14, and the first vibrator and the second vibrator which are oppositely arranged in a fluid pipe at a predetermined angle with respect to a flow of fluid.

16. A semiconductor integrated circuit device comprising:
a first terminal arranged to accept external input of an analog input signal;
an amplifier configured to amplify the analog input signal to generate an amplified signal;
a logic unit configured to generate a digital output signal that is in accordance with the amplified signal;
a second terminal arranged to externally output an analog output signal that is in accordance with the amplified signal; and
a further terminal,
wherein
the first terminal is disposed at a first side of a package, the second terminal is disposed at a second side which is different from the first side, and the further terminal is disposed at each of four corners of the package and is a test terminal, a ground terminal, or an unused terminal.

* * * * *